(12) United States Patent
Hiyoshi et al.

(10) Patent No.: US 9,728,633 B2
(45) Date of Patent: Aug. 8, 2017

(54) SILICON CARBIDE SEMICONDUCTOR DEVICE AND METHOD FOR MANUFACTURING THE SAME

(71) Applicant: Sumitomo Electric Industries, Ltd., Osaka-shi (JP)

(72) Inventors: Toru Hiyoshi, Osaka (JP); Keiji Wada, Osaka (JP); Takeyoshi Masuda, Osaka (JP); Yu Saitoh, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/031,194

(22) PCT Filed: Sep. 8, 2014

(86) PCT No.: PCT/JP2014/073624
§ 371 (c)(1),
(2) Date: Apr. 21, 2016

(87) PCT Pub. No.: WO2015/060027
PCT Pub. Date: Apr. 30, 2015

(65) Prior Publication Data
US 2016/0247911 A1    Aug. 25, 2016

(30) Foreign Application Priority Data
Oct. 24, 2013 (JP) ................. 2013-221095

(51) Int. Cl.
*H01L 29/78* (2006.01)
*H01L 21/04* (2006.01)
(Continued)

(52) U.S. Cl.
CPC ........ *H01L 29/7813* (2013.01); *H01L 21/049* (2013.01); *H01L 21/3065* (2013.01);
(Continued)

(58) Field of Classification Search
CPC ..................... H01L 29/4236; H01L 29/7813
See application file for complete search history.

(56) References Cited

U.S. PATENT DOCUMENTS 6,020,600 A * 2/2000 Miyajima ......... H01L 29/66068
257/289
8,759,909 B2 * 6/2014 Wang ............... H01L 29/41775
257/330

(Continued)

FOREIGN PATENT DOCUMENTS

JP    11-121741 A     4/1999
JP    2005-191487 A   7/2005
(Continued)

OTHER PUBLICATIONS

International Search Report in PCT International Application No. PCT/JP2014/073624, dated Dec. 16, 2014.

*Primary Examiner* — Benjamin Sandvik
(74) *Attorney, Agent, or Firm* — Venable LLP; Michael A. Sartori; Laura G. Remus

(57) ABSTRACT

A silicon carbide semiconductor device includes: a silicon carbide semiconductor layer having a main surface, the main surface being provided with a trench which has a bottom portion and a sidewall inclined with respect to the main surface; a gate insulating film covering each of the bottom portion and the sidewall; a gate electrode provided at least on the gate insulating film; and an upper insulating film provided on the main surface and having a part which protrudes into the trench.

9 Claims, 12 Drawing Sheets

(51) Int. Cl.
*H01L 29/66* (2006.01)
*H01L 29/04* (2006.01)
*H01L 29/16* (2006.01)
*H01L 21/3065* (2006.01)
*H01L 29/423* (2006.01)

(52) U.S. Cl.
CPC ........ *H01L 29/045* (2013.01); *H01L 29/1608* (2013.01); *H01L 29/42376* (2013.01); *H01L 29/66068* (2013.01)

(56) References Cited

U.S. PATENT DOCUMENTS

| | | | |
|---|---|---|---|
| 2004/0124461 A1* | 7/2004 | Gajda | H01L 29/4933 257/330 |
| 2004/0166656 A1* | 8/2004 | Numazawa | H01L 21/28185 438/589 |
| 2012/0049202 A1* | 3/2012 | Nakano | H01L 29/7813 257/77 |
| 2012/0248461 A1* | 10/2012 | Masuda | H01L 21/3065 257/77 |
| 2012/0313112 A1* | 12/2012 | Wada | H01L 29/045 257/77 |
| 2013/0043490 A1 | 2/2013 | Sorada | |
| 2013/0168701 A1 | 7/2013 | Kiyosawa et al. | |
| 2013/0175548 A1* | 7/2013 | Kudou | H01L 21/02164 257/77 |
| 2014/0008664 A1 | 1/2014 | Kudou | |
| 2014/0162439 A1 | 6/2014 | Masuda et al. | |
| 2015/0214354 A1* | 7/2015 | Nakano | H01L 29/0869 257/77 |
| 2015/0295079 A1* | 10/2015 | Nakano | H01L 29/401 257/330 |

FOREIGN PATENT DOCUMENTS

| | | |
|---|---|---|
| JP | 2012-216701 A | 11/2012 |
| JP | 5209152 B1 | 6/2013 |
| WO | WO-2012/132229 A1 | 10/2012 |
| WO | WO-2013/001677 A1 | 1/2013 |
| WO | WO-2013/114477 A1 | 8/2013 |

\* cited by examiner

SILICON CARBIDE SEMICONDUCTOR DEVICE AND METHOD FOR MANUFACTURING THE SAME

TECHNICAL FIELD

The present invention relates to a silicon carbide semiconductor device and a method for manufacturing the same.

BACKGROUND ART

Silicon carbide (hereinafter also referred to as "SiC") is considered as a promising material for next-generation power semiconductor devices. Particularly in recent years, development of trench-type MOSFETs (Metal-Oxide-Semiconductor Field-Effect Transistors) using SiC which are dominant as power switching elements has been actively pursued (see, for example, Japanese Patent No. 5209152 (PTD 1)).

CITATION LIST

Patent Document

PTD 1: Japanese Patent No. 5209152

SUMMARY OF INVENTION

Technical Problem

Since trench-type MOSFETs can be densely arranged with a greater number of cells per unit area than that of planar-type MOSFETs, they are advantageous to reduce resistance. However, trench-type MOSFETs have a problem that breakdown voltage is reduced due to occurrence of a high electric field resulting from a trench structure.

In a trench-type MOSFET, the bottom portion of a trench is conventionally known as a portion to which a high electric field tends to be applied. The breakdown voltage has been improved by thickly forming a gate insulating film at this portion.

Further, it has been found in recent years that a portion to which a high electric field tends to be applied is also present at an upper end of a trench sidewall. This portion will be described with reference to FIG. 23. FIG. 23 is a cross sectional view showing one example of a configuration of a trench-type MOSFET as a reference example. As shown in FIG. 23, a silicon carbide semiconductor device 901 of the reference example includes an upper corner portion CN protruding toward a gate insulating film 191, at a connection portion between a main surface MP of a silicon carbide semiconductor layer 900 and a sidewall SW of a trench TR. Here, a MOS structure including a gate electrode 192, gate insulating film 191, and an n+ type SiC layer 183 is formed at upper corner portion CN. When a gate is driven, a voltage of approximately 15 to 20 V is applied to upper corner portion CN. Since the thickness of gate insulating film 191 is typically 50 to 60 nm, when the above voltage is applied, an electric field of 3 to 4 MV/cm is applied to gate insulating film 191 which is in contact with upper corner portion CN.

Further, in the structure as shown in FIG. 23, gate electrode 192 is arranged to cover upper corner portion CN. Accordingly, the electric field from gate electrode 192 concentrates on upper corner portion CN from a plurality of directions.

When the electric field locally concentrates on upper corner portion CN in this manner, a leak current called FN (Fowler-Nordheim) tunnel current is generated at gate insulating film 191 which is in contact with that portion, reducing the life of gate insulating film 191. PTD 1 proposes a method for relaxing an electric field applied to upper corner portion CN by forming that portion to have a rounded shape. However, silicon carbide semiconductor devices are desired to have a further improved breakdown voltage, and there is still room for improvement in this regard.

In view of the aforementioned problem, an object of the present invention is to provide a silicon carbide semiconductor device having a high breakdown voltage.

Solution to Problem

A silicon carbide semiconductor device in accordance with one aspect of the present invention includes: a silicon carbide semiconductor layer having a main surface, the main surface being provided with a trench which has a bottom portion and a sidewall inclined with respect to the main surface; a gate insulating film covering each of the bottom portion and the sidewall; a gate electrode provided at least on the gate insulating film; and an upper insulating film provided on the main surface and having a part which protrudes into the trench.

Advantageous Effects of Invention

According to the above description, a silicon carbide semiconductor device having a high breakdown voltage can be provided.

DESCRIPTION OF EMBODIMENTS

Figure 1:
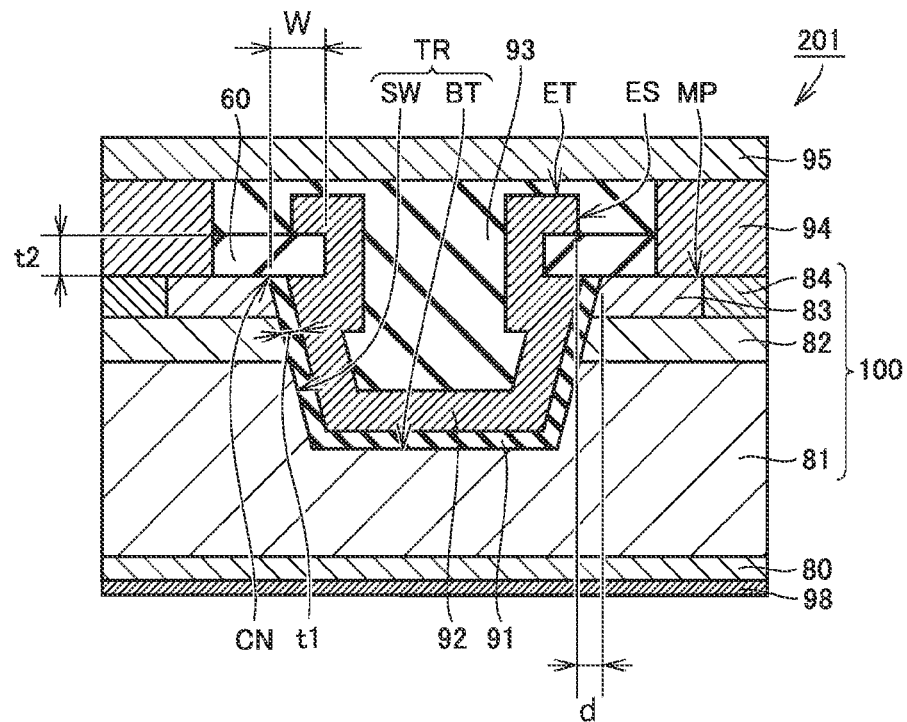
FIG. 1 is a partial cross sectional view schematically showing one example of a configuration of a silicon carbide semiconductor device in one embodiment of the present invention, along a line I-I in FIG. 2.

Hereinafter, an embodiment in accordance with the present invention will be described in more detail. It is noted that, in the drawings below, the same or corresponding elements have the same reference characters allotted and description thereof will not be repeated. In addition, regarding crystallographic denotation herein, an individual orientation, a group orientation, an individual plane, and a group plane are shown in [ ], < >, ( ) and { }, respectively. Moreover, a crystallographically negative index is normally expressed by a number with a bar "-" thereabove, however, a negative sign herein precedes a number.

Description of Embodiment of the Invention of the Present Application

First, an overview of an embodiment of the invention of the present application (hereafter also referred to as the "present embodiment") will be described, as listed below in (1) to (10).

As a result of earnest studies to solve the aforementioned problem, the inventor of the present invention obtained a finding that an electric field applied to an upper corner portion can be significantly relaxed by utilizing a mask layer used when a trench is formed in a silicon carbide semiconductor layer. Based on that finding, the inventor of the present invention conducted further studies, and thereby completed the present embodiment. That is, a silicon carbide semiconductor device in accordance with the present embodiment includes the following configuration.

(1) The silicon carbide semiconductor device of the present embodiment includes: a silicon carbide semiconductor layer 100 having a main surface MP, main surface MP being provided with a trench TR which has a bottom portion BT and a sidewall SW inclined with respect to main surface MP; a gate insulating film 91 covering each of bottom portion BT and sidewall SW; a gate electrode 92 provided at least on gate insulating film 91; and an upper insulating film 60 provided on main surface MP and having a part which protrudes into trench TR.

As described above, upper corner portion CN, to which a high electric field tends to be applied, is present at a connection portion between main surface MP and sidewall SW of trench TR. In the silicon carbide semiconductor device of the present embodiment, upper insulating film 60 having the part which protrudes into trench TR is formed on main surface MP, and gate electrode 92 is kept away from upper corner portion CN. That is, upper corner portion CN is protected by upper insulating film 60. Thereby, electric field concentration on upper corner portion CN is significantly relaxed, and the breakdown voltage of the silicon carbide semiconductor device is improved.

(2) Preferably, a thickness t2 of upper insulating film 60 is thicker than a thickness t1 of a portion of gate insulating film 91 which covers sidewall SW. Thereby, electric field concentration on upper corner portion CN can be further relaxed.

(3) Preferably, an upper end portion ET of gate electrode 92 is located at the same depth as an upper surface of upper insulating film 60 in a depth direction of trench TR, or is located below the upper surface in the depth direction. Thereby, electric field concentration on upper corner portion CN can be further relaxed.

(4) Preferably, sidewall SW has an inclined angle of more than or equal to 50° and less than or equal to 70° with respect to a {0001} plane of silicon carbide semiconductor layer 100. When the inclined angle of sidewall SW is within the above range, channel resistance can be reduced by providing a channel region at sidewall SW.

(5) Preferably, sidewall SW is provided with a surface which includes a first surface S1 having a plane orientation of {0-33-8}. Channel resistance can be reduced by forming a channel region at such a surface.

(6) The present embodiment also relates to a method for manufacturing the silicon carbide semiconductor device described above, and the manufacturing method includes: a step S10 of preparing silicon carbide semiconductor layer 100 having main surface MP; a step S20 of forming upper insulating film 60 having an opening OP, on main surface MP; a step S30 of forming trench TR which has bottom portion BT and sidewall SW inclined with respect to main surface MP, in a region of silicon carbide semiconductor layer 100 below opening OP, using upper insulating film 60 as a mask, upper insulating film 60 having a part which protrudes into trench TR; a step S40 of forming gate insulating film 91 covering each of bottom portion BT and sidewall SW, with upper insulating film 60 remaining; and a step S50 of forming gate electrode 92 at least on gate insulating film 91.

According to the manufacturing method described above, upper insulating film 60 having the part which protrudes into trench TR can be easily formed, utilizing a mask layer used to form trench TR. Thereby, a silicon carbide semiconductor device in which electric field concentration on upper corner portion CN is relaxed and which has a high breakdown voltage can be manufactured.

(7) Preferably, step S50 of forming gate electrode 92 includes the step of forming gate electrode 92 to extend onto an upper surface of upper insulating film 60, and the step of removing a portion of gate electrode 92 which extends on the upper surface of upper insulating film 60. Thereby, a silicon carbide semiconductor device having a further improved breakdown voltage can be manufactured.

(8) Preferably, step S50 of forming gate electrode 92 includes the step of forming gate electrode 92 by a low-pressure chemical vapor deposition method. By using the low-pressure chemical vapor deposition (LP-CVD) method, the material to serve as gate electrode 92 can also be deposited on a lower side of the part of upper insulating film 60 which protrudes into trench TR.

(9) Preferably, in step S20 of forming upper insulating film 60, upper insulating film 60 is formed to be thicker than a thickness of a portion of gate insulating film 91 which covers sidewall SW. Thereby, a silicon carbide semiconductor device in which electric field concentration on upper corner portion CN is further relaxed can be manufactured.

(10) Preferably, step S30 of forming trench TR includes the step of etching silicon carbide semiconductor layer 100 by thermal etching. By forming trench TR using thermal etching, trench TR having sidewall SW inclined with respect to main surface MP of silicon carbide semiconductor layer 100 can be easily formed.

Details of Embodiment of the Invention of the Present Application

Hereinafter, the silicon carbide semiconductor device in accordance with the present embodiment will be described in more detail. However, the present embodiment is not limited thereto.

<Silicon Carbide Semiconductor Device>

A silicon carbide semiconductor device 201 in accordance with the present embodiment shown in FIG. 1 is configured as a vertical MOSFET having a trench structure. Silicon carbide semiconductor device 201 has a single crystal substrate 80, silicon carbide semiconductor layer 100 (an epitaxial layer), upper insulating film 60, gate insulating film 91, gate electrode 92, an interlayer insulating film 93, a source electrode 94, a source interconnection layer 95, and a drain electrode 98.

Main surface MP, which is an upper surface of silicon carbide semiconductor layer 100, is provided with trench TR which has bottom portion BT and sidewall SW inclined with respect to main surface MP. In silicon carbide semiconductor device 201, a channel region is formed along sidewall SW.

Silicon carbide semiconductor layer 100 includes upper corner portion CN at the connection portion between main surface MP and sidewall SW. Upper corner portion CN is a portion of an n+ layer 83 described later. Since n+ layer 83 is a layer which contains a lot of electrons, when an electric field from gate electrode 92 concentrates on upper corner portion CN, electrons are collected to upper corner portion CN all at once, which may cause a leak current.

In the present embodiment, upper insulating film 60 having a part which protrudes into trench TR is formed on main surface MP. By having the part which protrudes into trench TR, upper insulating film 60 reliably protects upper corner portion CN. Thus, upper insulating film 60 regulates a distance between gate electrode 92 and upper corner portion CN, and significantly relaxes the electric field from gate electrode 92. Accordingly, silicon carbide semiconductor device 201 can have a high breakdown voltage.

The material for upper insulating film 60 is not particularly limited. For example, upper insulating film 60 can be formed of a silicon oxide ($SiO_2$) film, a silicon nitride (SiN) film, a silicon oxynitride film (SiON), or the like. Further, upper insulating film 60 may also be formed, for example, utilizing a mask layer used to form trench TR. When a mask layer is utilized, a $SiO_2$ film is suitable as upper insulating film 60.

In the present embodiment, upper insulating film 60 has the part which protrudes into trench TR. A width W of that part (a horizontal distance between upper corner portion CN and a side end portion of upper insulating film 60 on the trench TR side) is preferably more than or equal to 150 nm, more preferably more than or equal to 300 nm, and further preferably more than or equal to 500 nm. This is because, the greater width W of that part is, the more electric field concentration can be relaxed. Although an upper limit value of width W is not particularly limited, it is preferably less than or equal to 1000 nm, from the viewpoint of device miniaturization.

Preferably, thickness $t2$ of upper insulating film 60 is thicker than thickness $t1$ of a portion of gate insulating film 91 which covers sidewall SW. That is, "thickness $t1$ of a portion of gate insulating film 91 which covers sidewall SW" refers to a thickness of a portion of gate insulating film 91 which covers the channel region. Thereby, a gate voltage can be efficiently applied while relaxing electric field concentration on upper corner portion CN. Specifically, thickness $t2$ of upper insulating film 60 preferably satisfies the relation $t2 \geq 1.5 t1$. More specifically, thickness $t2$ of upper insulating film 60 is preferably more than or equal to 50 nm, more preferably more than or equal to 60 nm, and further preferably more than or equal to 70 nm. Further, thickness $t2$ of upper insulating film 60 is less than or equal to 80 nm, for example.

In silicon carbide semiconductor device 201 shown in FIG. 1, gate electrode 92 extends onto the upper surface of upper insulating film 60. Here, from the viewpoint of further improving the effect of relaxing the electric field, gate electrode 92 is preferably located on the upper surface of upper insulating film 60 to be closer to the inside of trench TR relative to a position directly above upper corner portion CN. Specifically, a horizontal distance d between a side end portion ES of gate electrode 92 and the position directly above upper corner portion CN on the upper surface of upper insulating film 60 is preferably more than or equal to 150 nm, more preferably more than or equal to 300 nm, and further preferably more than or equal to 500 nm.

Hereinafter, other components of silicon carbide semiconductor device 201 will be described. It is noted that the conductivity type of each layer or region in the following description is merely exemplary, and each layer or region may have a conductivity type different therefrom.

Silicon carbide semiconductor layer 100 is a SiC layer epitaxially grown on single crystal substrate 80. Single crystal substrate 80 has n type conductivity type. Silicon carbide semiconductor layer 100 has a hexagonal crystal structure having a polytype of 4H. By adopting such a crystal structure, ON resistance of silicon carbide semiconductor device 201 can be reduced. Silicon carbide semiconductor layer 100 has an n drift layer 81, a p body layer 82, n+ layer 83, and a p contact region 84.

N drift layer 81 has n type conductivity type. N drift layer 81 preferably has an impurity concentration lower than that of single crystal substrate 80. Here, the impurity concentration of n drift layer 81 is preferably more than or equal to $1\times10^{15}$ cm$^{-3}$ and less than or equal to $5\times10^{16}$ cm$^{-3}$.

P body layer 82 has p type conductivity type. P body layer 82 is provided within n drift layer 81. The impurity concentration of p body layer 82 is preferably more than or equal to $5\times10^{15}$ cm$^{-3}$ and less than or equal to $2\times10^{18}$ cm$^{-3}$, and can be set, for example, to approximately $1\times10^{18}$ cm$^{-3}$.

N+ layer 83 and p contact region 84 are provided within p body layer 82. N+ layer 83 and p contact region 84 constitute portions of main surface MP.

Here, n drift layer 81 is exposed at bottom portion BT of trench TR, and a portion of n drift layer 81, p body layer 82, and n+ layer 83 are exposed at sidewall SW of trench TR. Gate insulating film 91 covers each of bottom portion BT and sidewall SW. Further, gate electrode 92 is provided on gate insulating film 91 and upper insulating film 60. Thereby, the channel region is formed along p body layer 82 exposed at sidewall SW.

Figure 2:
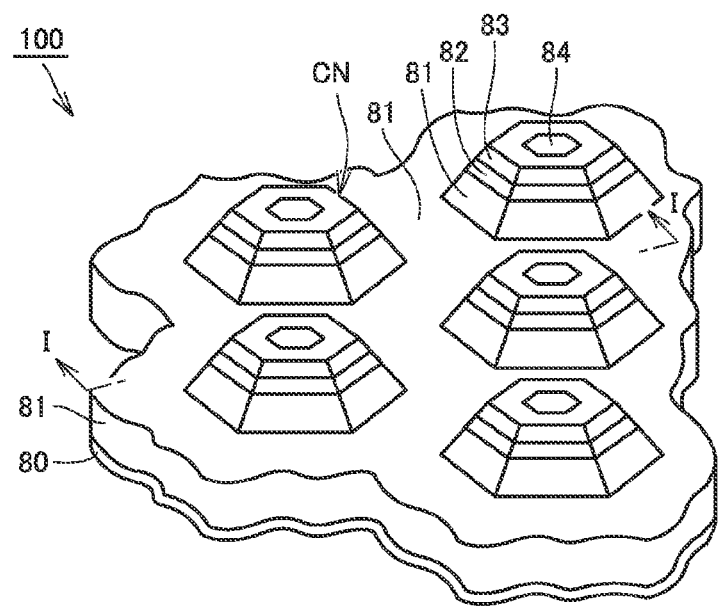
FIG. 2 is a partial perspective view schematically showing a shape of a silicon carbide semiconductor layer of the silicon carbide semiconductor device in FIG. 1.

Here, a shape of silicon carbide semiconductor layer 100 will be described with reference to FIG. 2. FIG. 2 is a partial perspective view schematically showing a shape of silicon carbide semiconductor layer 100 of silicon carbide semiconductor device 201 in FIG. 1. As shown in FIG. 2, trench TR extends to form a mesh having a honeycomb structure, and n drift layer 81 is exposed at bottom portion BT of trench TR. Sidewall SW is formed to constitute an inclined surface of a truncated hexagonal pyramid (mesa structure), and a portion of n drift layer 81, p body layer 82, and n+ layer 83 are exposed at sidewall SW. Main surface MP constitutes a top surface of the mesa structure, and has a hexagonal shape when viewed in a plan view. In the mesa structure, p contact region 84 is formed substantially at the center of the top surface, and its planar shape is similar to a hexagon (top surface).

Upper corner portion CN is formed at the connection portion between main surface MP and sidewall SW. In the present embodiment, upper insulating film 60 (not shown in FIG. 2) is formed on main surface MP, and upper insulating film 60 protrudes into trench TR like eaves.

Referring to FIG. 1 again, source electrode 94 is provided on n+ layer 83 and p contact region 84 to be in contact with each of n+ layer 83 and p contact region 84. Interlayer insulating film 93 is provided on gate electrode 92 and upper insulating film 60 to insulate gate electrode 92 from source electrode 94. Source interconnection layer 95 is formed on interlayer insulating film 93 and source electrode 94 to be in contact therewith. Further, drain electrode 98 is provided on a lower surface of silicon carbide semiconductor layer 100 opposite to main surface MP, with single crystal substrate 80 being interposed therebetween.

(Special Surface)

In the present embodiment, as described above, trench TR has sidewall SW inclined with respect to main surface MP. Sidewall SW preferably has an inclined angle of more than or equal to 50° and less than or equal to 70° with respect to a {0001} plane of silicon carbide semiconductor layer 100, and more preferably has an inclined angle of more than or equal to 50° and less than or equal to 70° with respect to a (000-1) plane of silicon carbide semiconductor layer 100. This is because channel resistance is reduced in the channel region formed along p body layer 82 exposed at sidewall SW. It is noted that the inclined angle is more preferably more than or equal to 54° and less than or equal to 66°, and further preferably more than or equal to 58° and less than or equal to 62°.

Further, sidewall SW preferably has a prescribed crystal plane (hereinafter referred to as a "special surface"), in particular at a portion on p body layer 82. Specifically, sidewall SW is preferably provided with a surface which includes first surface S1 having a plane orientation of {0-33-8}. Hereinafter, this special surface will be described in detail.

Figure 13:
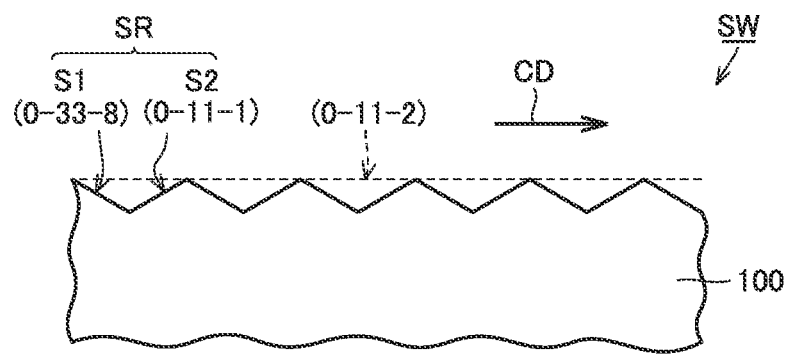
FIG. 13 is a partial cross sectional view schematically showing a microstructure at a surface of the silicon carbide semiconductor layer of the silicon carbide semiconductor device.

Sidewall SW provided with the special surface includes surface S1 (the first surface) having a plane orientation of {0-33-8} as shown in FIG. 13. In other words, on sidewall SW of trench TR, p body layer 82 is provided with a surface which includes surface S1. Surface S1 preferably has a plane orientation of (0-33-8).

More preferably, sidewall SW microscopically includes surface S1, and sidewall SW microscopically further includes a surface S2 (a second surface) having a plane orientation of {0-11-1}. Here, "microscopic" means "in detail to such an extent that a dimension about twice as large as interatomic spacing is at least taken into consideration". As a method of observing such a microscopic structure, for example, TEM (Transmission Electron Microscope) can be employed. It is noted that surface S2 preferably has a plane orientation of (0-11-1).

Further preferably, surface S1 and surface S2 of sidewall SW form a combined surface SR having a plane orientation of {0-11-2}. That is, combined surface SR is formed by periodic repetition of surfaces S1 and S2. Such a periodic structure can be observed, for example, with TEM or AFM (Atomic Force Microscopy). In this case, combined surface SR has an off angle of 62° macroscopically with respect to the {000-1} plane. Here, "macroscopic" means "ignoring a microstructure having a dimension as small as interatomic spacing". As a method of measuring such a macroscopic off angle, for example, a method with the use of general X-ray diffraction can be employed. Further, combined surface SR preferably has a plane orientation of (0-11-2). In this case, combined surface SR has an off angle of 62° macroscopically with respect to the (000-1) plane.

Further, a channel direction CD representing a direction in which carriers flow over a channel surface (that is, a thickness direction of a MOSFET (the vertical direction in FIG. 1 and the like)) preferably extends along a direction in which the periodic repetition described above appears. Next, a detailed structure of combined surface SR will be described.

Figure 14:
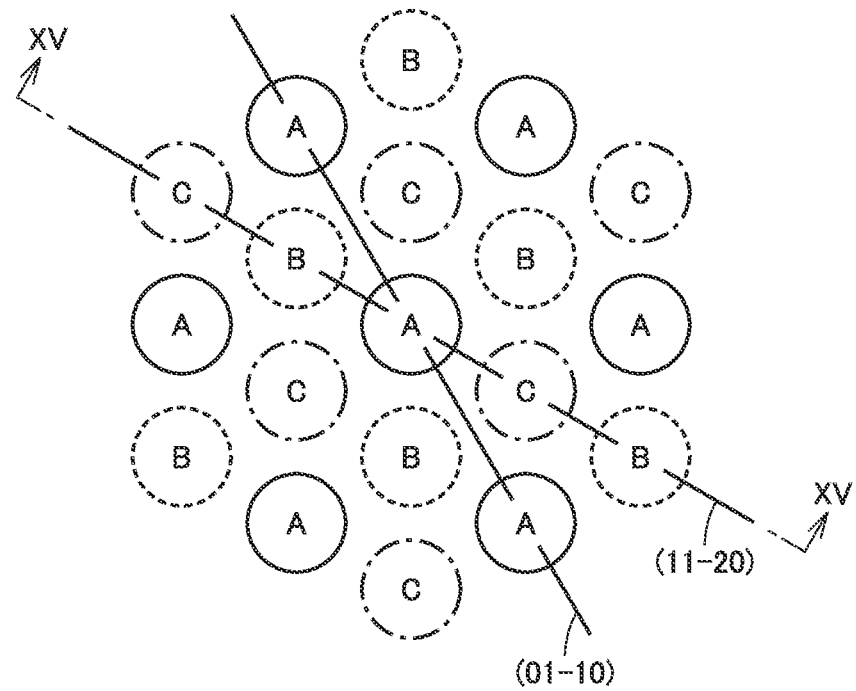
FIG. 14 is a diagram showing a crystal structure at a (000-1) plane in a hexagonal crystal having a polytype of 4H.

In general, when a SiC single crystal having a polytype of 4H is viewed from the (000-1) plane, as shown in FIG. 14, Si atoms (or C atoms) are provided such that atoms in an A layer (a solid line in the figure), atoms in a B layer located thereunder (a dashed line in the figure), atoms in a C layer located thereunder (a chain dotted line in the figure), and atoms in a B layer located thereunder (not shown) are repeatedly provided. Namely, such a periodic stack structure as ABCBABCBABCB . . . with four layers of ABCB being defined as one period is provided.

Figure 15:
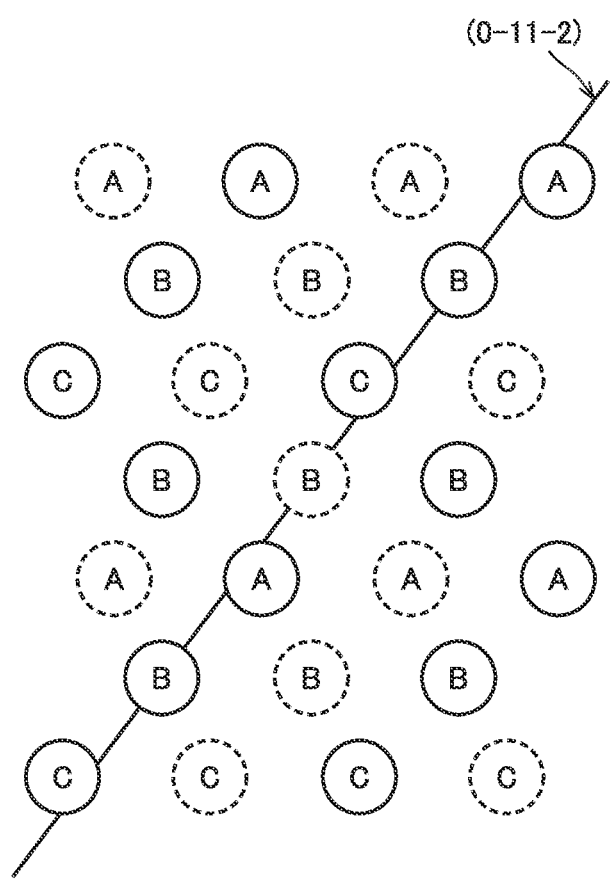
FIG. 15 is a diagram showing a crystal structure at a (11-20) plane along a line XV-XV in FIG. 14.

As shown in FIG. 15, at a (11-20) plane (a cross section along the line XV-XV in FIG. 14), atoms in each layer of four layers of ABCB forming one period described above are not aligned to completely extend along a (0-11-2) plane. FIG. 15 shows the (0-11-2) plane as it passes through positions of atoms in the B layer, and in this case, it can be seen that atoms in each of the A layer and the C layer are displaced from the (0-11-2) plane. Therefore, even though a macroscopic plane orientation of a surface of the silicon carbide single crystal, that is, a plane orientation in a case where an atomic-level structure is ignored, is limited to (0-11-2), this surface can microscopically take various structures.

Figure 16:
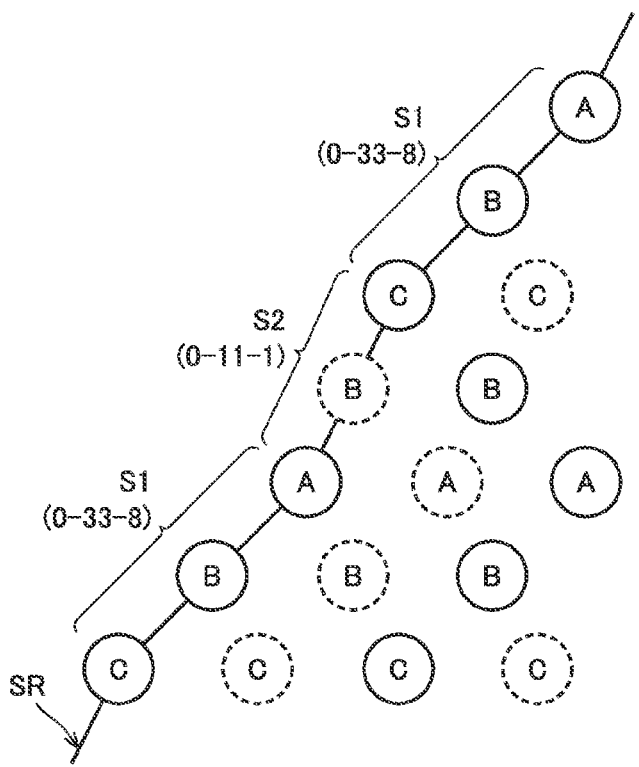
FIG. 16 is a diagram showing in a (11-20) plane, a crystal structure in the vicinity of a surface of a combined surface in FIG. 13.

As shown in FIG. 16, combined surface SR is formed in such a manner that surface S1 having the plane orientation of (0-33-8) and surface S2 connected to surface S1 and having a plane orientation different from the plane orientation of surface S1 are alternately provided. A length of each of surface S1 and surface S2 is twice as large as interatomic spacing of Si atoms (or C atoms). It is noted that a surface obtained by averaging surface S1 and surface S2 corresponds to the (0-11-2) plane.

Figure 17:
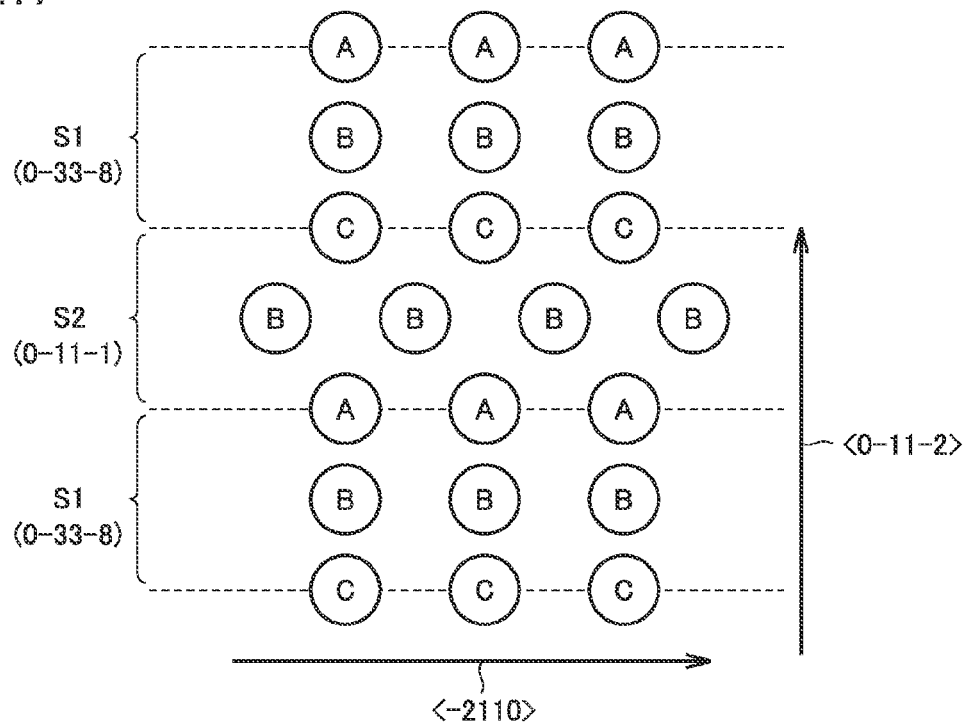
FIG. 17 is a diagram when the combined surface in FIG. 13 is viewed from a (01-10) plane.

As shown in FIG. 17, when combined surface SR is viewed from a (01-10) plane, a single crystal structure periodically includes a structure equivalent to cubic crystal in part (a portion of surface S1). Specifically, combined surface SR is formed in such a manner that surface S1 having a plane orientation of (001) in the structure equivalent to the cubic crystal described above and surface S2 connected to surface S1 and having a plane orientation different from the plane orientation of surface S1 are alternately provided. Thus, it is also possible for a polytype other than 4H to form a surface from a surface having the plane orientation of (001) in the structure equivalent to the cubic crystal (surface S1 in FIG. 17) and a surface connected to this surface and having a plane orientation different from this plane orientation (surface S2 in FIG. 17). The polytype may be, for example, 6H or 15R.

Figure 18:
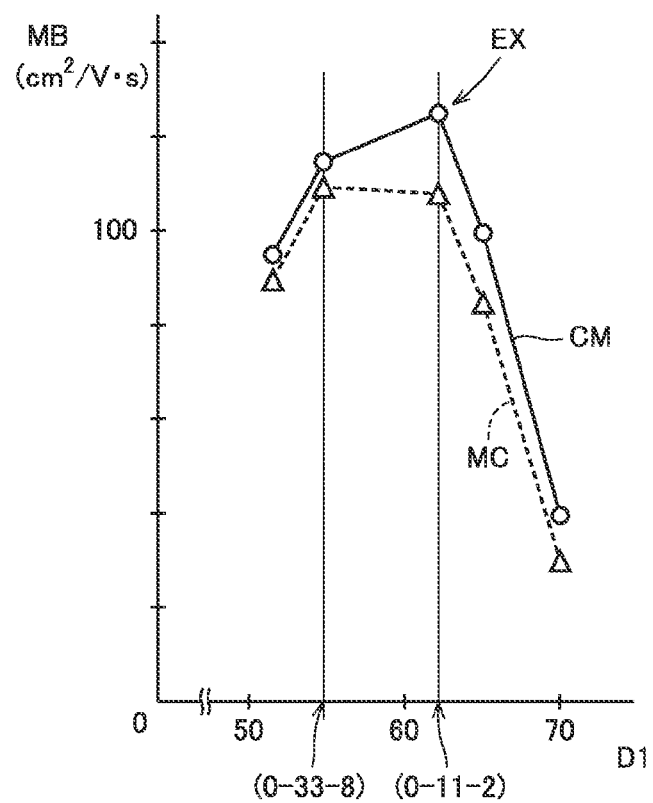
FIG. 18 is a graph showing one example of relation of a macroscopically viewed angle between a channel surface and a (000-1) plane with channel mobility, in each of a case where thermal etching is performed and a case where it is not performed.

Relation between a crystal plane of sidewall SW and mobility MB of a channel surface will now be described with reference to FIG. 18. In the graph in FIG. 18, the abscissa represents an angle D1 (°) formed between a macroscopic plane orientation of sidewall SW having a channel surface and the (000-1) plane, and the ordinate represents mobility MB. A plot group CM corresponds to a case where sidewall SW is finished as a special surface through thermal etching, and a plot group MC corresponds to a case where such thermal etching is not performed. It is noted that thermal etching will be described later.

Mobility MB in plot group MC was highest when a macroscopic plane orientation of the surface of the channel surface was set to (0-33-8). This may be because, in a case where thermal etching is not performed, that is, a microscopic structure of the channel surface is not particularly controlled, by setting a macroscopic plane orientation to (0-33-8), a ratio of formation of a microscopic plane orientation of (0-33-8), that is, a plane orientation of (0-33-8) in a case of considering even an atomic level, was probabilistically high.

On the other hand, mobility MB in plot group CM was highest when a macroscopic plane orientation of the surface of the channel surface was set to (0-11-2) (an arrow EX). This may be because, as a large number of surfaces S1 each having the plane orientation of (0-33-8) are regularly and densely arranged with surface S2 being interposed as shown in FIGS. 16 and 17, a ratio occupied by the microscopic plane orientation of (0-33-8) was high at the surface of the channel surface.

Figure 19:
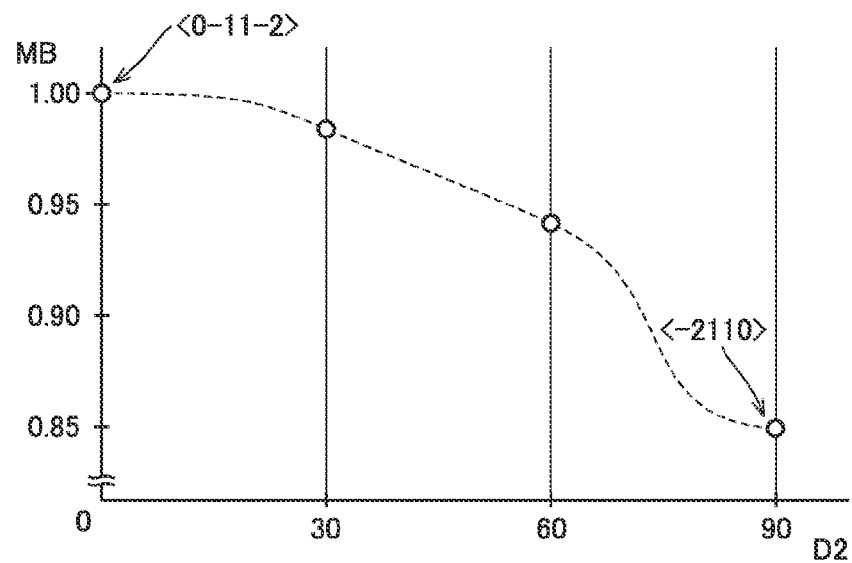
FIG. 19 is a graph showing one example of relation of an angle between a channel direction and a <0-11-2> direction with channel mobility.

It is noted that, on combined surface SR, mobility MB has orientation dependency. In the graph shown in FIG. 19, the abscissa represents an angle D2 (°) between a channel direction and a <0-11-2> direction, and the ordinate represents mobility MB (arbitrary unit) of the channel surface. A dashed line is supplementarily provided in order to facilitate viewing of the graph. It was found from this graph that, in order to increase channel mobility MB, angle D2 which channel direction CD (FIG. 13) has is preferably more than or equal to 0° and less than or equal to 60°, and more preferably substantially 0°.

Figure 20:
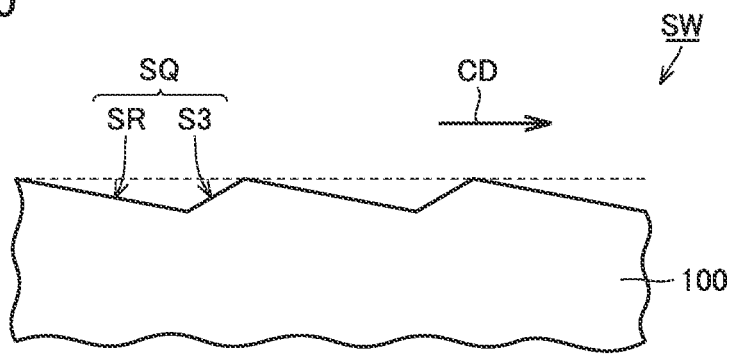
FIG. 20 is a diagram showing a variation of FIG. 13.

As shown in FIG. 20, sidewall SW may further include a surface S3 (a third surface) in addition to combined surface SR. More specifically, sidewall SW may include a combined surface SQ formed by periodic repetition of surface S3 and combined surface SR. In this case, an off angle of sidewall SW with respect to the {000-1} plane is deviated from 62° which is an ideal off angle of combined surface SR. This deviation is preferably small and preferably within a range of ±10°. A surface included in such a range of angles is exemplified by a surface having a macroscopic plane orientation of a {0-33-8} plane. More preferably, an off angle of sidewall SW with respect to the (000-1) plane is deviated from 62° which is an ideal off angle of combined surface SR. This deviation is preferably small and preferably within a range of ±10°. A surface included in such a range of angles is exemplified by a surface having a macroscopic plane orientation of a (0-33-8) plane. Such a periodic structure can be observed, for example, with TEM or AFM.

For reasons described above, on sidewall SW (FIG. 1) of trench TR, p body layer 82 is preferably provided with a surface which includes surface S1 (FIG. 13) having a plane orientation of {0-33-8}. Thus, of the ON resistance of silicon carbide semiconductor device 201, a resistance of a channel portion formed from p body layer 82 can be reduced. Therefore, a higher resistance of n drift layer 81 is allowed. Therefore, the impurity concentration of n drift layer 81 can be further reduced. Thereby, the silicon carbide semiconductor device can have a further higher breakdown voltage.

It is noted that this surface may microscopically include surface S1 and this surface may microscopically further include surface S2 (FIG. 13) having a plane orientation of {0-11-1}. Surfaces S1 and S2 of this surface preferably form combined surface SR (FIG. 13) having a plane orientation of {0-11-2}. Further, this surface more preferably macroscopically has an off angle of 62°±10° with respect to the {000-1} plane. Thus, the resistance of the channel portion can be further reduced.

<Variation>

Figure 22:
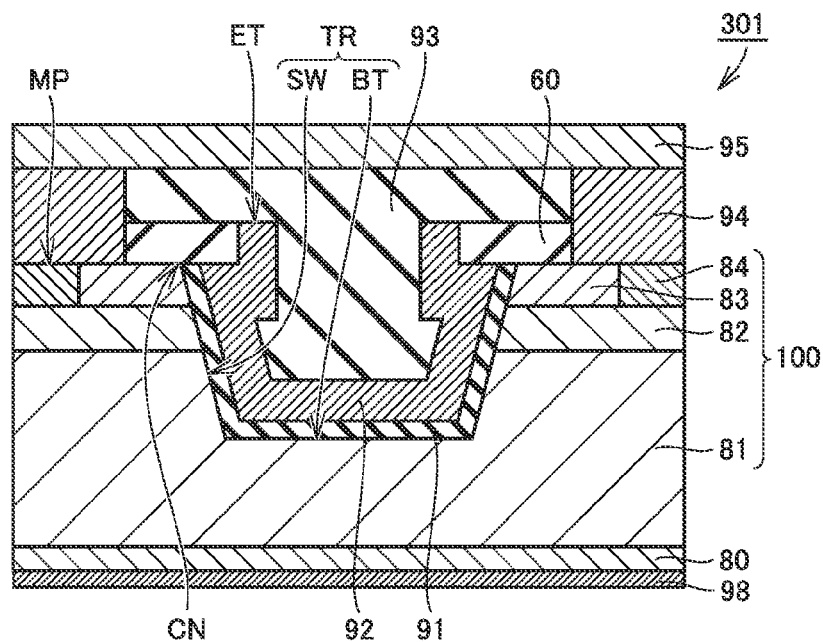
FIG. 22 is a partial cross sectional view schematically showing a variation of the configuration of the silicon carbide semiconductor device in one embodiment of the present invention.
Figure 23:
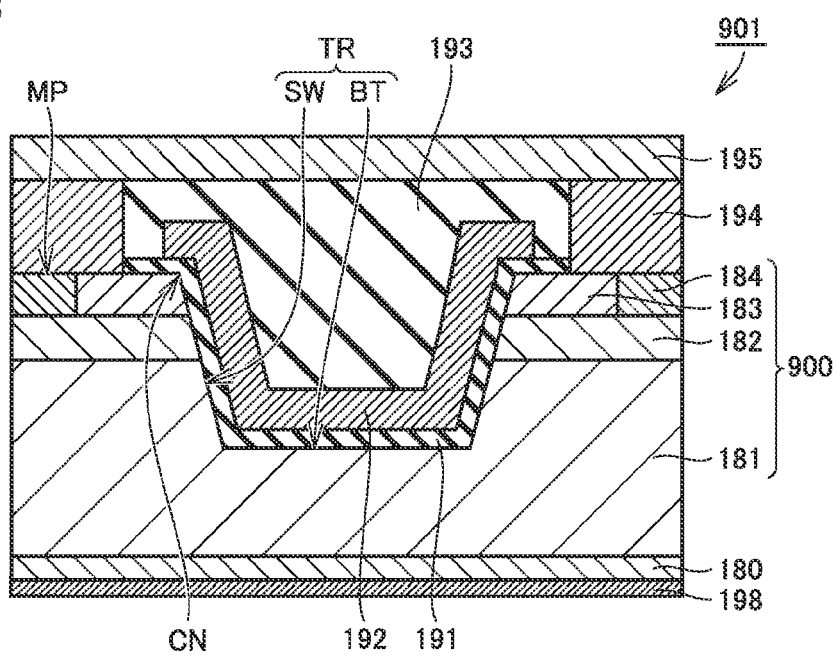
FIG. 23 is a partial cross sectional view schematically showing one example of a configuration of a silicon carbide semiconductor device of a reference example.

Next, a variation of the present embodiment will be described. FIG. 22 is a cross sectional view schematically showing a configuration of a silicon carbide semiconductor device 301 in accordance with a variation of the present embodiment. Silicon carbide semiconductor device 301 is different from silicon carbide semiconductor device 201 shown in FIG. 1 in that upper end portion ET of gate electrode 92 is located at the same depth as the upper surface of upper insulating film 60 in a depth direction of trench TR. By providing gate electrode 92 so as not to cover the upper surface of upper insulating film 60, an electric field applied from gate electrode 92 to upper corner portion CN is restricted to an electric field from a lateral direction only. Therefore, electric field concentration on upper corner portion CN can be relaxed more efficiently. It is noted that upper end portion ET of gate electrode 92 is more preferably located below the upper surface of upper insulating film 60 in the depth direction of trench TR.

Although the example where bottom portion BT of trench TR is substantially a flat surface has been described in the embodiment and the variation thereof described above, the shape of bottom portion BT of trench TR is not limited thereto in the present embodiment. For example, trench TR may have a V-shaped section and bottom portion BT may be linearly formed, or bottom portion BT may have a curved shape (may be U-shaped).

<Method for Manufacturing Silicon Carbide Semiconductor Device>

Figure 21:
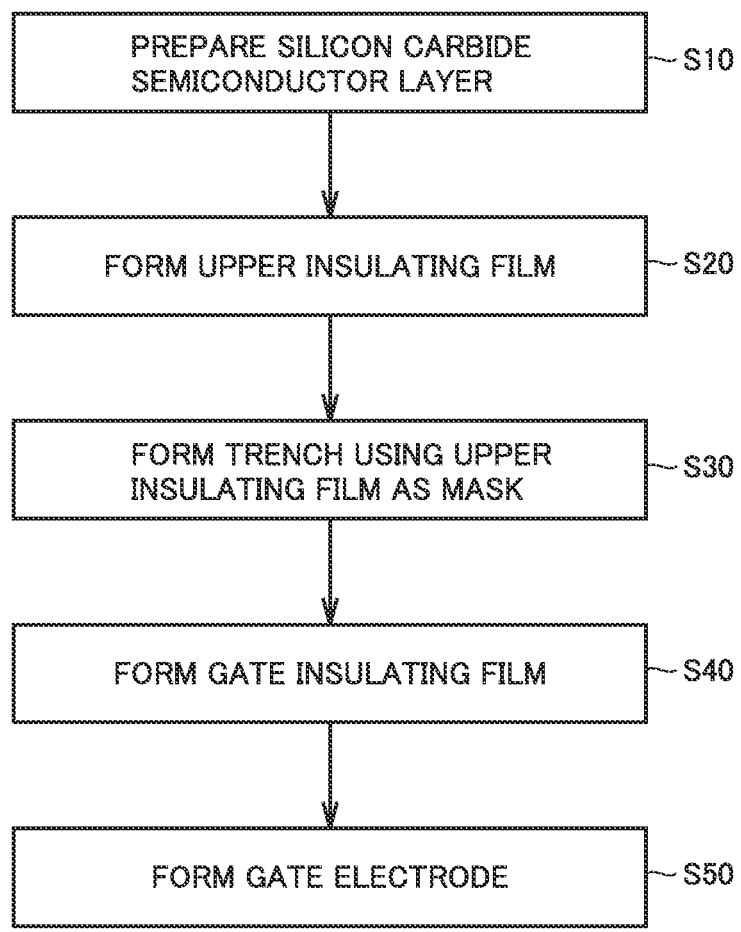
FIG. 21 is a flowchart schematically showing a method for manufacturing the silicon carbide semiconductor device in one embodiment of the present invention.

The silicon carbide semiconductor device in accordance with the present embodiment described above can be manufactured by a manufacturing method described below. FIG. 21 is a flowchart schematically showing a method for manufacturing the silicon carbide semiconductor device in accordance with the present embodiment. As shown in FIG. 21, the manufacturing method includes step S10, step S20, step S30, step S40, and step S50. Hereinafter, each step will be described.

(Step S10)

In step S10, silicon carbide semiconductor layer 100 is prepared. Silicon carbide semiconductor layer 100 is prepared, for example, by epitaxial growth on single crystal substrate 80 and ion implantation.

Figure 3:
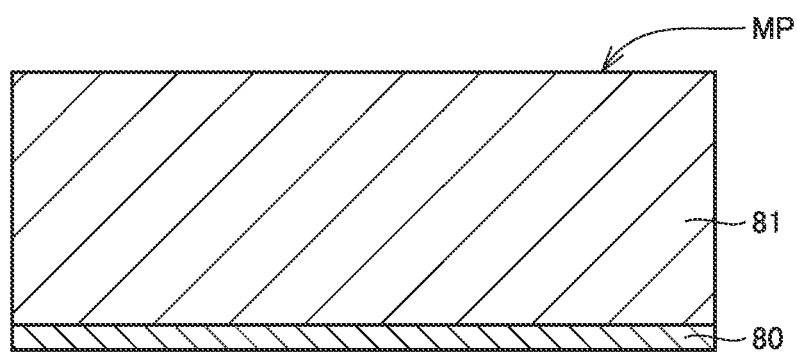
FIG. 3 is a partial cross sectional view schematically showing a portion of a process for manufacturing the silicon carbide semiconductor device in one embodiment of the present invention.

Referring to FIG. 3, n drift layer 81 to be a portion of silicon carbide semiconductor layer 100 is formed on single crystal substrate 80 by epitaxial growth. Here, single crystal substrate 80 can be obtained by slicing an ingot (not shown) made of, for example, hexagonal SiC having a polytype of 4H. The epitaxial growth of n drift layer 81 can be performed by a CVD method that uses a mixed gas of silane ($SiH_4$) and propane ($C_3H_8$), for example, as a source gas, and uses hydrogen gas ($H_2$), for example, as a carrier gas. On this occasion, it is preferable to introduce nitrogen (N) or phosphorus (P), for example, as an impurity. An upper surface of n drift layer 81 obtained as described above serves as main surface MP of silicon carbide semiconductor layer 100.

Figure 4:
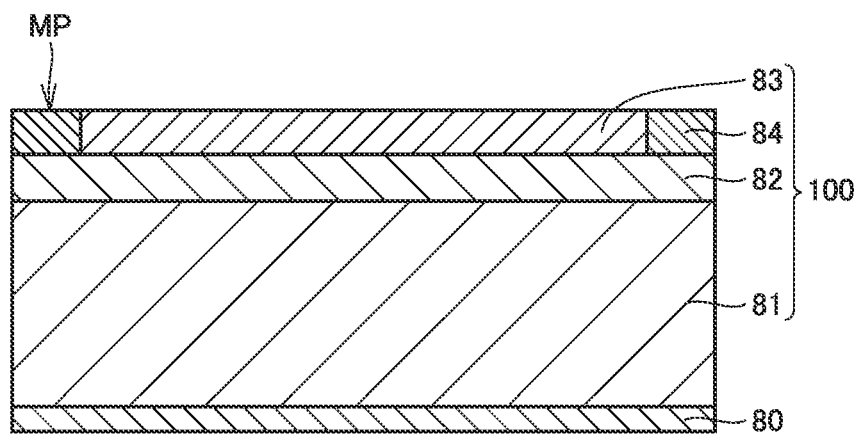
FIG. 4 is a partial cross sectional view schematically showing a portion of the process for manufacturing the silicon carbide semiconductor device in one embodiment of the present invention.

Next, referring to FIG. 4, p body layer 82, n+ layer 83, and p contact region 84 are formed within n drift layer 81. These can be formed, for example, by performing ion implantation on the entire surface of n drift layer 81. In the ion implantation for forming p body layer 82 and p contact region 84, ions of an impurity for imparting p type, for example Al or the like, are implanted. In the ion implantation for forming n+ layer 83, ions of an impurity for imparting n type, for example phosphorus (P) or the like, are implanted. For the ion implantation for each layer and region, an implantation mask (not shown) made of a conventionally known photoresist or the like is used. It is noted that, instead of ion implantation, epitaxial growth accompanied by addition of impurities may be used.

Next, heat treatment for activating the impurities is performed. Thereby, a desired carrier is generated in each impurity region. The temperature for the heat treatment on this occasion is preferably more than or equal to 1500° C. and less than or equal to 1900° C., and is approximately 1700° C., for example. The time for the heat treatment can be set to approximately 30 minutes, for example. The atmosphere for the heat treatment is preferably an inert gas atmosphere, and is preferably an argon (Ar) atmosphere, for example. Thus, silicon carbide semiconductor layer 100 is prepared.

(Step S20)

Figure 5:
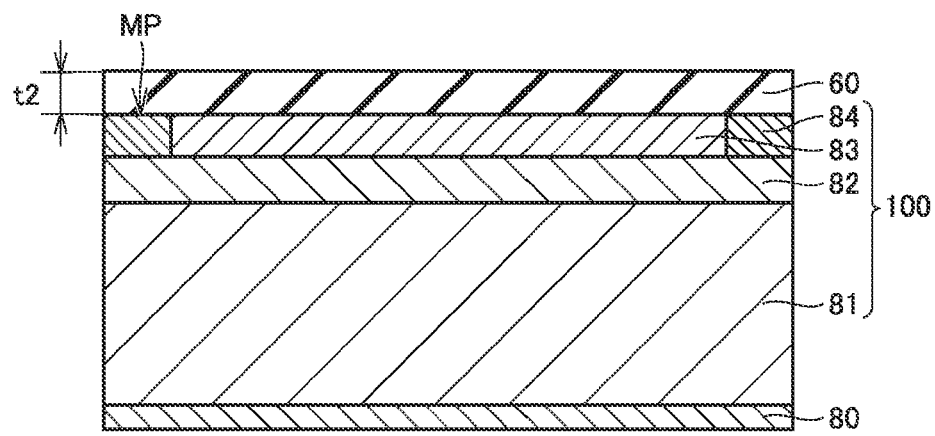
FIG. 5 is a partial cross sectional view schematically showing a portion of the process for manufacturing the silicon carbide semiconductor device in one embodiment of the present invention.

In step S20, upper insulating film 60 having opening OP is formed on main surface MP of silicon carbide semiconductor layer 100. First, as shown in FIG. 5, upper insulating film 60 is formed on main surface MP. Upper insulating film 60 is made of, for example, silicon oxide ($SiO_2$), silicon nitride (SiN), silicon oxynitride (SiON), or the like, and can be formed, for example, by a thermal oxidation method or the CVD method. On this occasion, upper insulating film 60 is preferably formed such that its thickness t2 is thicker than thickness t1 of a portion of gate insulating film 91 formed later which covers sidewall SW of trench TR.

Figure 6:
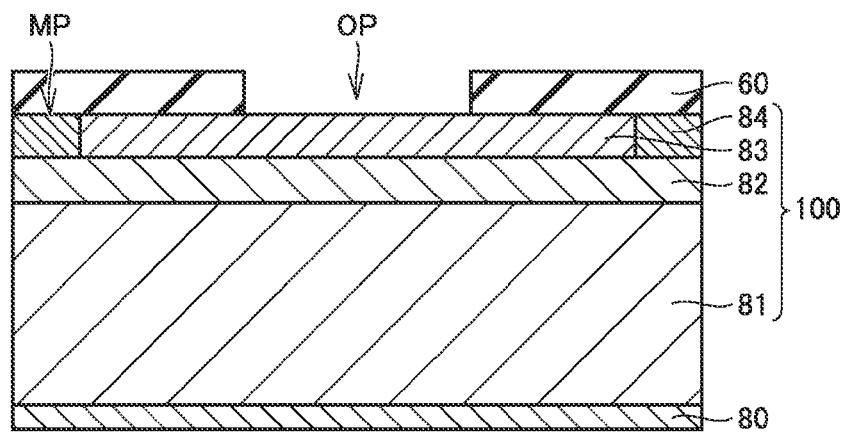
FIG. 6 is a partial cross sectional view schematically showing a portion of the process for manufacturing the silicon carbide semiconductor device in one embodiment of the present invention.

Next, referring to FIG. 6, opening OP is formed in upper insulating film 60. Opening OP can be formed by removing a portion of upper insulating film 60 by etching using $CF_4$ or $CHF_3$, for example.

(Step S30)

Figure 7:
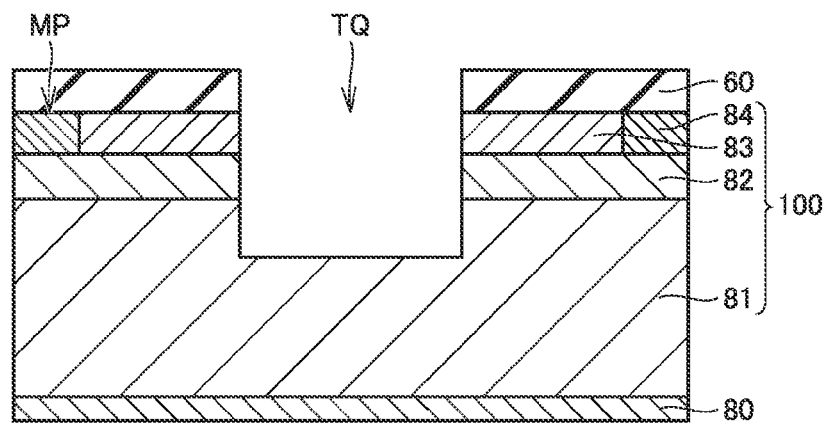
FIG. 7 is a partial cross sectional view schematically showing a portion of the process for manufacturing the silicon carbide semiconductor device in one embodiment of the present invention.

In step S30, trench TR is formed in a region of silicon carbide semiconductor layer 100 below opening OP, using upper insulating film 60 formed in step S20 as a mask. First, referring to FIG. 7, a trench TQ having a sidewall substantially perpendicular to main surface MP is formed in a region where trench TR should be formed. Trench TQ can be formed, for example, by reactive ion etching (RIE) or inductively coupled plasma (ICP)-RIE. Specifically, ICP-RIE using, for example, $SF_6$ or a mixed gas of $SF_6$ and $O_2$ as a reactive gas can be employed.

Figure 8:
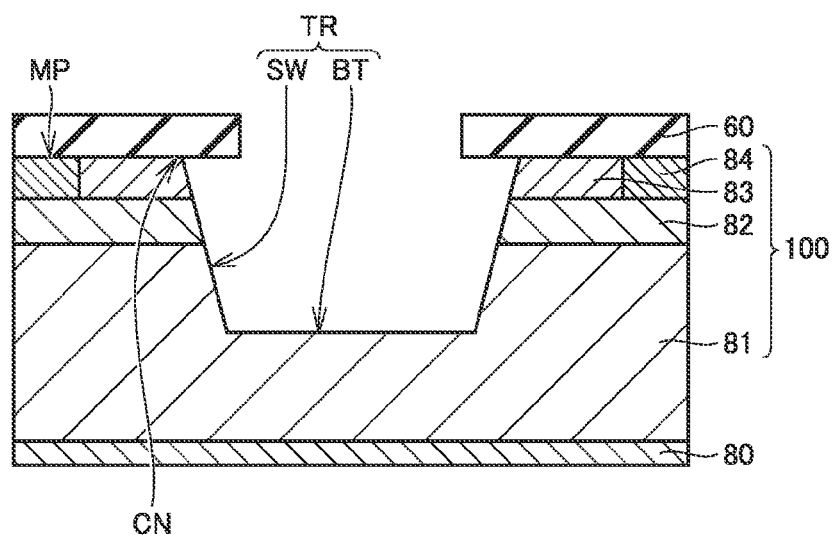
FIG. 8 is a partial cross sectional view schematically showing a portion of the process for manufacturing the silicon carbide semiconductor device in one embodiment of the present invention.

Next, referring to FIG. 8, trench TR which has bottom portion BT and sidewall SW inclined with respect to main surface MP is formed. Thereby, upper insulating film 60 has a part which protrudes into trench TR. As a method for forming such trench TR, for example, a method of performing thermal etching on trench TQ (FIG. 7) is suitable.

The thermal etching can be performed, for example, through heating in an atmosphere containing a reactive gas having at least one or more types of halogen atoms. Here, the at least one or more types of halogen atoms include at least any of chlorine (Cl) atoms and fluorine (F) atoms. This atmosphere is, for example, of $Cl_2$, $BCl_3$, $SF_6$, or $CF_4$. The thermal etching is performed in such a manner that, for example, a mixed gas of chlorine gas and oxygen gas is used as a reactive gas and the temperature for heat treatment is set to, for example, more than or equal to 700° C. and less than or equal to 1000° C.

It is noted that the reactive gas may contain a carrier gas in addition to the chlorine gas and the oxygen gas described above. For example, nitrogen ($N_2$) gas, argon (Ar) gas, helium (He) gas, or the like can be employed as a carrier gas. Then, in a case where the temperature for heat treatment is set to more than or equal to 700° C. and less than or equal to 1000° C. as described above, a rate of etching SiC attains, for example, to approximately 70 μm/hour. In addition, in this case, upper insulating film 60 made of $SiO_2$ is not substantially etched during etching of SiC, because it has an extremely high selectivity with respect to SiC. As a result, upper insulating film 60 has a part which protrudes into trench TR. Thereby, upper corner portion CN serving as a connection portion between main surface MP and sidewall SW is protected by upper insulating film 60.

(Step S40)

In step S40, gate insulating film 91 covering each of bottom portion BT and sidewall SW of trench TR is formed, with upper insulating film 60 remaining. Conventionally, upper insulating film 60, which is a mask for positioning trench TR, is removed before gate insulating film 91 is formed. In the present embodiment, upper insulating film 60 remains, and thereby electric field concentration on upper corner portion CN can be relaxed.

Figure 9:
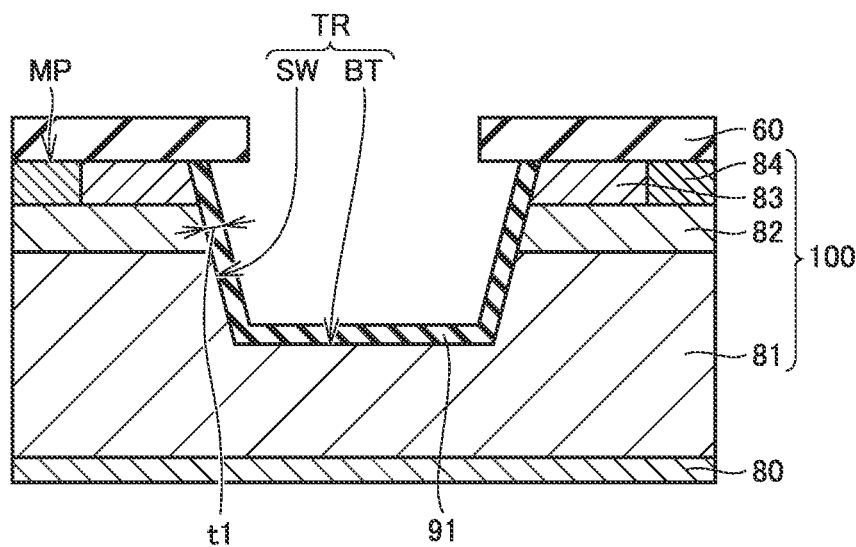
FIG. 9 is a partial cross sectional view schematically showing a portion of the process for manufacturing the silicon carbide semiconductor device in one embodiment of the present invention.

Referring to FIG. 9, gate insulating film 91 is formed with upper insulating film 60 remaining. Gate insulating film 91 is preferably formed by thermal oxidation. The thermal oxidation can be performed, for example, in an atmosphere containing oxygen, at a temperature of more than or equal to 1250° C.

After gate insulating film 91 is formed, NO annealing using nitric oxide (NO) gas as an atmospheric gas may be performed. The NO annealing can be performed, for example, by holding gate insulating film 91 at a temperature of more than or equal to 1100° C. and less than or equal to 1300° C., for approximately one hour. Thereby, nitrogen atoms are introduced into an interface region between gate insulating film 91 and p body layer 82. As a result, formation of an interface state in the interface region is suppressed, and thus channel mobility is improved. It is noted that a gas other than NO gas may be used as an atmospheric gas, if the gas allows such introduction of nitrogen atoms.

After the NO annealing, Ar annealing using argon (Ar) as an atmospheric gas may be further performed. Preferably, the heating temperature for the Ar annealing is higher than the heating temperature for the NO annealing described above, and is lower than the melting point of gate insulating film 91. The heating temperature is held for approximately one hour, for example. Thereby, formation of the interface state in the interface region between gate insulating film 91 and p body layer 82 is further suppressed, and thus channel mobility can be further improved. It is noted that, as an atmospheric gas, another inert gas such as nitrogen gas can be used instead of Ar.

(Step S50)

Figure 10:
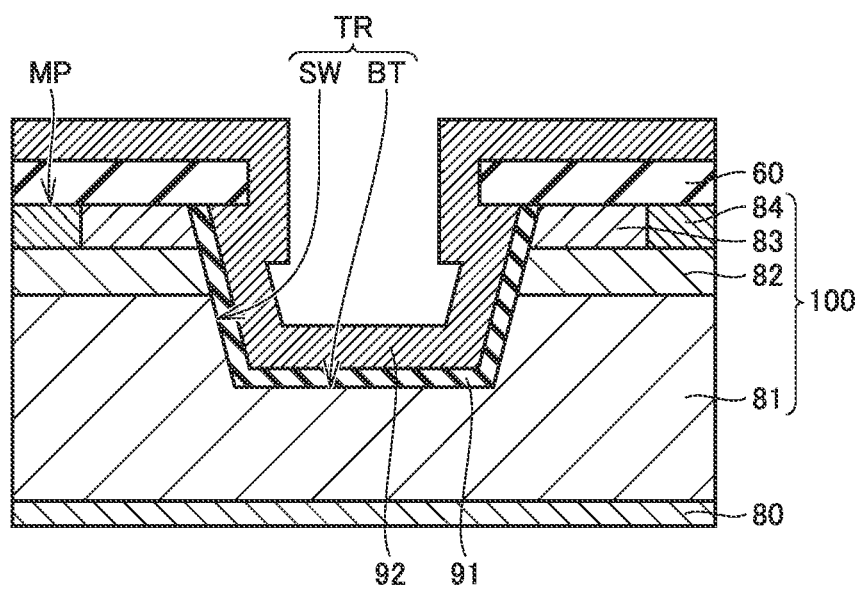
FIG. 10 is a partial cross sectional view schematically showing a portion of the process for manufacturing the silicon carbide semiconductor device in one embodiment of the present invention.

Next, referring to FIG. 10, gate electrode 92 is formed at least on gate insulating film 91. Here, the expression "formed at least on gate insulating film 91" indicates that gate electrode 92 may be formed, for example, to extend onto the upper surface of upper insulating film 60 (FIG. 10), or may be formed only on gate insulating film 91.

Gate electrode 92 can be made of polysilicon containing an impurity such as phosphorus, for example, and can be formed by the CVD method. Here, gate electrode 92 is preferably formed by an LP-CVD method. By using the LP-CVD method, the material to serve as gate electrode 92 can also be deposited on a lower side of the part of upper insulating film 60 which protrudes into trench TR and the like, as shown in FIG. 10.

Formation of gate electrode 92 by the LP-CVD method can be performed, for example, by using silane as a reactive gas, and setting the temperature to more than or equal to approximately 500° C. and less than or equal to approximately 700° C. as well as setting the pressure to more than or equal to approximately 0.1 Torr and less than or equal to approximately 10 Torr.

Figure 11:
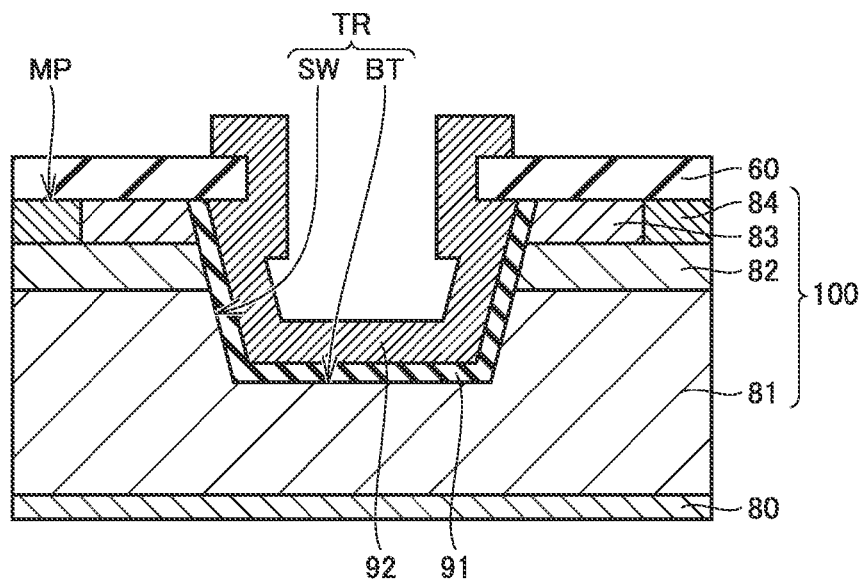
FIG. 11 is a partial cross sectional view schematically showing a portion of the process for manufacturing the silicon carbide semiconductor device in one embodiment of the present invention.
Figure 12:
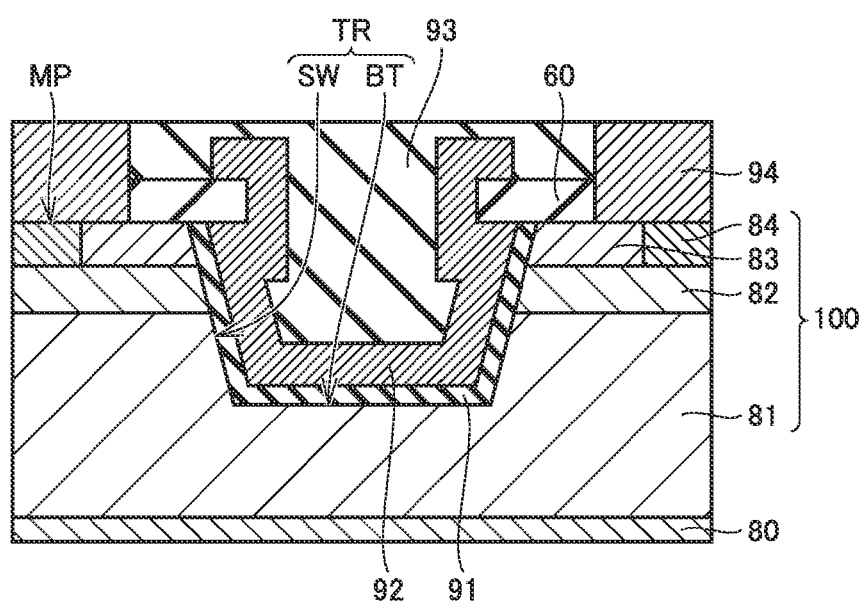
FIG. 12 is a partial cross sectional view schematically showing a portion of the process for manufacturing the silicon carbide semiconductor device in one embodiment of the present invention.

Next, referring to FIG. 11, a part of the portion of gate electrode 92 extending on the upper surface of upper insulating film 60 is removed. The part of gate electrode 92 can be removed, for example, by patterning through a photolithography method and RIE.

On this occasion, the portion of gate electrode 92 extending on the upper surface of upper insulating film 60 can also be entirely etched back by RIE. In this case, upper end portion ET of gate electrode 92 is located at the same depth as the upper surface of upper insulating film 60 in the depth direction of trench TR, and thereby silicon carbide semiconductor device 301 shown in FIG. 22 can be manufactured.

(Subsequent Steps)

Thereafter, interlayer insulating film 93 is formed to cover an exposed surface of gate electrode 92 and the upper surface of upper insulating film 60. Next, etching is performed to form an opening in interlayer insulating film 93 and upper insulating film 60. Through this opening, each of n+ layer 83 and p contact region 84 is exposed at main surface MP. Then, source electrode 94 in contact with each of n+ layer 83 and p contact region 84 is formed on main surface MP. Further, drain electrode 98 is formed on a back surface of single crystal substrate 80 on a side opposite to the main surface side on which n drift layer 81 is formed.

Then, referring to FIG. 1 again, source interconnection layer 95 electrically connected with source electrode 94 is formed on interlayer insulating film 93. Thus, the silicon carbide semiconductor device in accordance with the present embodiment in which electric field concentration on upper corner portion CN is relaxed and which has a high breakdown voltage can be manufactured.

Although the embodiment of the present invention has been described above, it is also originally intended to combine the configurations of the embodiment and the variation thereof described above, as appropriate.

It should be understood that the embodiment and the variation thereof disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST

60: upper insulating film; 80, 181: single crystal substrate; 81, 181: n drift layer; 82, 182: p body layer; 83: n+ layer; 183: n+ type SiC layer; 84, 184: p contact region; 91, 191: gate insulating film; 92, 192: gate electrode; 93, 193: interlayer insulating film; 94, 194: source electrode; 95, 195: source interconnection layer; 98, 198: drain electrode; 100, 900: silicon carbide semiconductor layer; 201, 301, 901: silicon carbide semiconductor device; MP: main surface; OP: opening; TR, TQ: trench; BT: bottom portion; SW: sidewall; CN: upper corner portion; ET: upper end portion; ES: side end portion; t1, t2: thickness; W: width; d: distance; S1, S2, S3: surface; SR, SQ: combined surface; CD: direction.

The invention claimed is:

1. A silicon carbide semiconductor device, comprising:
   a silicon carbide semiconductor layer having a main surface, the main surface being provided with a trench which has a bottom portion and a sidewall inclined with respect to the main surface;
   a gate insulating film covering each of the bottom portion and the sidewall;
   a gate electrode provided at least on the gate insulating film; and
   an upper insulating film provided on the main surface,
   in a parallel direction with respect to the main surface, the upper insulating film having a side end portion which protrudes past the sidewall of the trench into the trench,
   the gate electrode extending to cover at least part of the side end portion, and
   wherein an upper end portion of the gate electrode is located at the same depth as an upper surface of the upper insulating film in a depth direction of the trench, or is located below the upper surface in the depth direction.

2. The silicon carbide semiconductor device according to claim 1, wherein a thickness of the upper insulating film is thicker than a thickness of a portion of the gate insulating film which covers the sidewall.

3. The silicon carbide semiconductor device according to claim 1, wherein the sidewall has an inclined angle of more than or equal to 50° and less than or equal to 70° with respect to a {0001} plane of the silicon carbide semiconductor layer.

4. The silicon carbide semiconductor device according to claim 1, wherein the sidewall is provided with a surface which includes a first surface having a plane orientation of {0-33-8}.

5. A method for manufacturing a silicon carbide semiconductor device, comprising the steps of:
preparing a silicon carbide semiconductor layer having a main surface;
forming an upper insulating film having an opening, on the main surface;
forming a trench which has a bottom portion and a sidewall inclined with respect to the main surface, in a region of the silicon carbide semiconductor layer below the opening, using the upper insulating film as a mask, the upper insulating film having a side end portion which protrudes past the sidewall of the trench into the trench in a parallel direction with respect to the main surface;
forming a gate insulating film covering each of the bottom portion and the sidewall, with the upper insulating film remaining; and
forming a gate electrode at least on the gate insulating film, the gate electrode extending to cover at least part of the side end portion.

6. The method for manufacturing the silicon carbide semiconductor device according to claim 5, wherein the step of forming the gate electrode includes the step of forming the gate electrode to extend onto an upper surface of the upper insulating film, and the step of removing a portion of the gate electrode which extends on the upper surface of the upper insulating film.

7. The method for manufacturing the silicon carbide semiconductor device according to claim 5, wherein the step of forming the gate electrode includes the step of forming the gate electrode by a low-pressure chemical vapor deposition method.

8. The method for manufacturing the silicon carbide semiconductor device according to claim 5, wherein, in the step of forming the upper insulating film, the upper insulating film is formed such that a thickness of the upper insulating film is thicker than a thickness of a portion of the gate insulating film which covers the sidewall.

9. The method for manufacturing the silicon carbide semiconductor device according to claim 5, wherein the step of forming the trench includes the step of etching the silicon carbide semiconductor layer by thermal etching.

* * * * *